(12) United States Patent
Chang et al.

(10) Patent No.: US 12,113,532 B2
(45) Date of Patent: Oct. 8, 2024

(54) PSEUDO RESISTOR WITH AUTOTUNE FUNCTION

(71) Applicant: Novatek Microelectronics Corp., Hsinchu (TW)

(72) Inventors: Chih-Yuan Chang, Hsinchu County (TW); Yu-Te Liao, Hsinchu (TW); Wei Cheng Liu, Nantou County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 18/091,381

(22) Filed: Dec. 30, 2022

(65) Prior Publication Data

US 2024/0223161 A1  Jul. 4, 2024

(51) Int. Cl.
*H03K 3/011* (2006.01)
*H03F 1/08* (2006.01)
*H03K 5/26* (2006.01)
*H03K 17/56* (2006.01)

(52) U.S. Cl.
CPC ............. *H03K 3/011* (2013.01); *H03F 1/08* (2013.01); *H03K 5/26* (2013.01); *H03K 17/56* (2013.01)

(58) Field of Classification Search
CPC .......... H03K 3/011; H03K 5/26; H03K 17/56; H03F 1/08
See application file for complete search history.

(56) References Cited

U.S. PATENT DOCUMENTS 10,778,165 B2 *  9/2020  Chandrakumar ... H03F 3/45744
11,184,196 B1 *  11/2021  Yang .................... H04L 25/0276
2013/0069716 A1 *  3/2013  Shiue .................... H03H 11/53
327/581
2018/0234081 A1  8/2018  Hung et al.
2020/0161031 A1  5/2020  Kaushik et al.

FOREIGN PATENT DOCUMENTS

| CN | 110752834 | | 2/2020 |
| CN | 111464149 | A * | 7/2020 |
| CN | 216531251 | | 5/2022 |
| EP | 2982996 | | 2/2016 |

OTHER PUBLICATIONS

"Office Action of Taiwan Counterpart Application", issued on Feb. 20, 2024, p. 1-p. 6.

* cited by examiner

*Primary Examiner* — Metasebia T Retebo
*Assistant Examiner* — James G Yeaman
(74) *Attorney, Agent, or Firm* — JCIPRNET

(57) ABSTRACT

Pseudo resistor having an auto-tune function automatically calibrates resistance of the pseudo resistor and compensates for DC drift based on an output signal of an electrical circuit to which the pseudo resistor is coupled, as to mitigate signal phenomenon in the output signal caused by PVT variation. The pseudo resistor includes first transistor, second transistor, and adder. The first terminal of the second transistor is coupled to the first terminal of the first transistor and forms a first common node. The control terminal of the first transistor is coupled to the control terminal of the second transistor and forms second common node. The adder is coupled between the first and second common nodes and configured to receive adjustment voltage for generating a bias voltage for controlling the first and second transistors, where the adjustment voltage corresponds to the output signal coupled to the second terminal of the second transistor.

20 Claims, 11 Drawing Sheets

PSEUDO RESISTOR WITH AUTOTUNE FUNCTION

BACKGROUND

Technical Field

The disclosure generally relates to a pseudo resistor, and more specifically, a voltage-controlled pseudo resistor having autotuning function.

Description of Related Art

Pseudo resistor is utilized for generating resistance for various circuit structures, as to generate electrical signals with large time constant. As compared to conventional resistor, the pseudo resistor occupies smaller area, having lower power consumption, etc. However, due to semiconductor fabrication, the pseudo resistor is sensitive to process, voltage and temperature (PVT) variation. The PVT variation affects the characteristics of the pseudo resistor which causes distortion in signal processing, inaccurate frequency response, filtering capability, etc. For example, resistance of pseudo resistor may be reduced as designed due to PVT variation. In an application of amplifier, this change in the resistance of pseudo resistor would affect the gain of the amplifier, and thus causes inaccurate signal processing.

SUMMARY

The disclosure introduces a pseudo resistor having an auto-tune function. The auto-tune function calibrates resistance of the pseudo resistor based on an output signal of the amplifier (or any other electrical components), as to mitigate the phenomenon 12 in the output signal caused by PVT variation of the pseudo resistor. In some embodiments, the auto-tune function further detects and compensates voltage drifting of the amplifier or other electrical components which the pseudo resistor is coupled to.

In some embodiments of the disclosure, a pseudo resistor is provided. The pseudo resistor includes a first transistor, a second transistor of same type of transistor as the first transistor, and an adder. The first terminal of the second transistor is coupled to the first terminal of the first transistor and forms a first common node. The control terminal of the first transistor is coupled to the control terminal of the second transistor and forms a second common node. The adder is coupled between the first common node and the second common node and configured to receive an adjustment voltage and generate a bias voltage controlling the first and second transistors. The adjustment voltage corresponds to an output signal coupled to the second terminal of the second transistor, where the output signal is generated based on an input signal coupled to the second terminal of the first transistor.

In some embodiments of the disclosure, an electrical circuit having a pseudo resistor for processing received signal is provided. The electrical circuit includes an amplifier and a calibration circuit. The amplifier includes an input terminal coupled to an input signal and an output terminal output an output signal. The amplifier is configured to generate an output signal at the output terminal based on an input signal coupled to the input terminal. The pseudo resistor is coupled to the amplifier to process the input signal. The calibration circuit is coupled to the output terminal of the amplifier and the pseudo resistor and configured to generate an adjustment voltage to adjust a resistance of the pseudo resistor based on an output signal of the amplifier.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
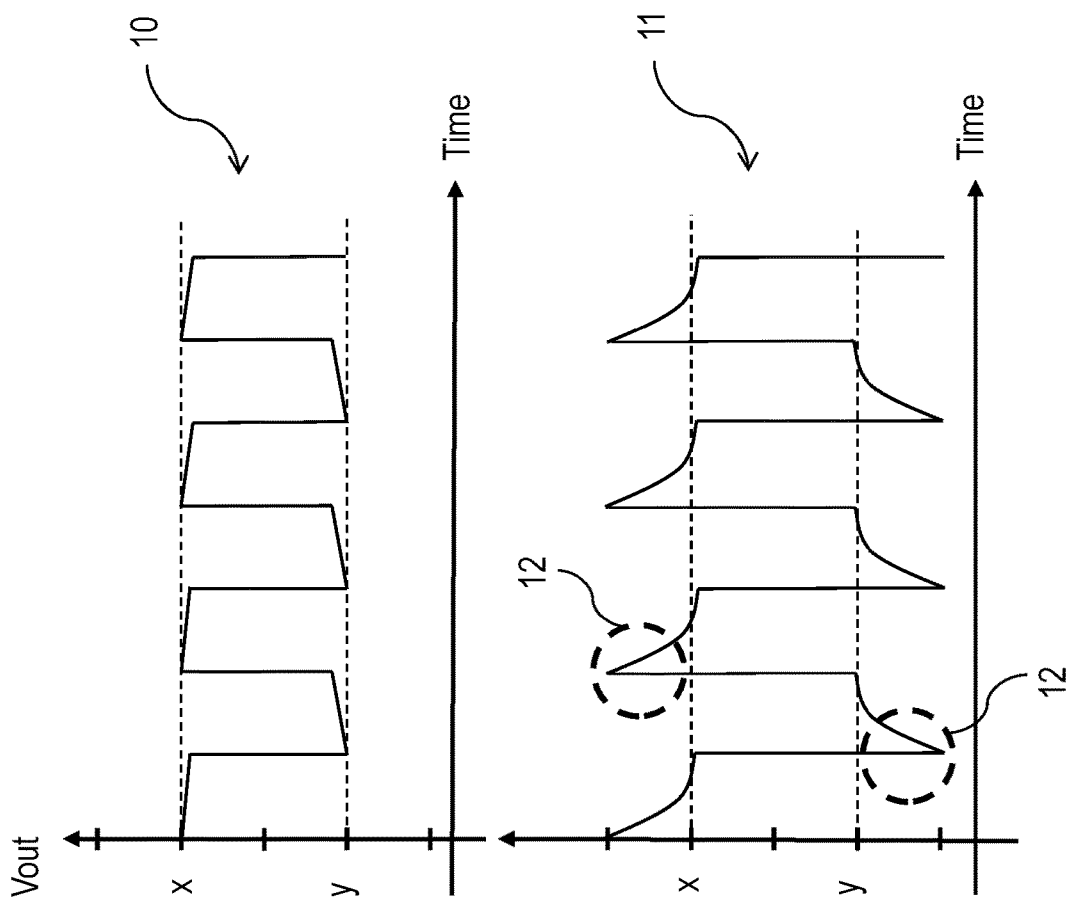
FIG. 1 is a diagram illustrating influences of the PVT variation of the pseudo resistor on the electrical signal in time domain.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Characteristics of pseudo resistor are sensitive to and affected by process, voltage and temperature (PVT) variation. For example, when the pseudo resistor is coupled to an amplifier for processing electrical signals, the output of the amplifier may be affected by the pseudo resistor due to the PVT variation, which causes inaccurate determination on the received electrical signals. FIG. 1 is a diagram illustrating influences of the PVT variation of the pseudo resistor on the electrical signal in time domain. Waveform 10 is an exemplary illustration of the output signal of the amplifier as expected. Waveform 11 is an exemplary illustration of the output signal of the amplifier under the influence of the PVT variation of the pseudo resistor to which the amplifier is coupled. In some embodiments, the waveform 10 may represent an output signal of the amplifier coupled to a pseudo resistor characterized in typical-typical (TT) corner of PVT variation. The waveform 10 oscillates between x and y as expected without an influence of the PVT variation of the pseudo resistor. On the other hand, the waveform 11 illustrates an influence to a pseudo resistor characterized in slow-slow (SS) corner of PVT variation to the output signal of the amplifier. The waveform 11 also oscillates between x and y, however, each of peak of the waveform 11 exceeds the expected value of x or y due to the PVT variation of the pseudo resistor. The waveform 11 shows phenomenon 12 (spikes) at both positive and negative peaks which are caused by a resistance of the pseudo resistor coupled to the amplifier. The resistance of the pseudo resistor changes due to the PVT variation of the pseudo resistor.

In an example of a signal amplifier, a pseudo resistor may be coupled between input and output of an amplifier for amplifying an electrical signal received at the input of the signal amplifier. As described above, the PVT variation of the pseudo resistor changes resistance of the pseudo resistor. The signal process of the signal amplifier would be influenced by the PVT variation of the pseudo resistor due to the change in the resistance, since the frequency response of the amplifier would be change due to the resistance of the pseudo resistor. The signal amplifier is only one example among variation applications of the pseudo resistor, and the disclosure is not intended to limit thereto.

The disclosure introduces a pseudo resistor having an auto-tune function. The auto-tune function calibrates resistance of the pseudo resistor based on an output signal of the amplifier (or any other electrical components), as to mitigate the phenomenon 12 in the output signal caused by PVT variation of the pseudo resistor. In some embodiments, the auto-tune function further detects and compensates voltage drifting of the amplifier or other electrical components which the pseudo resistor is coupled to. The detail of the pseudo resistor would be explained below.

Figure 2A:
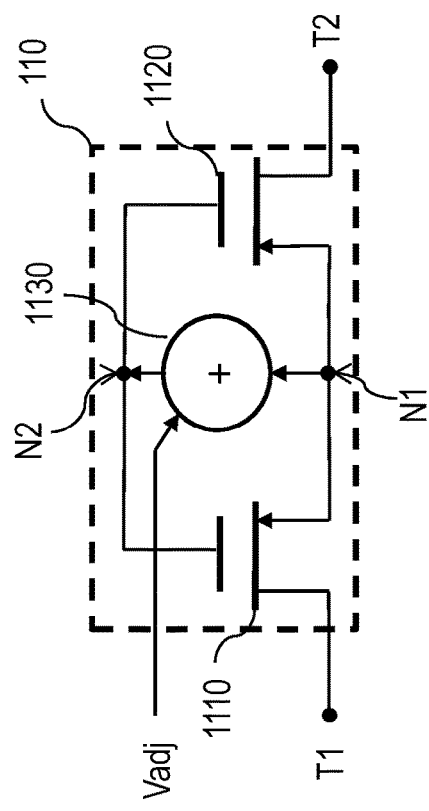
FIG. 2A is a diagram illustrating a pseudo resistor according to some embodiments of the disclosure.

FIG. 2A is a diagram illustrating a pseudo resistor 110 according to some embodiments of the disclosure. The pseudo resistor includes a first transistor 1110, a second transistor 1120, and an adder 1130. The first transistor 1110 includes a first terminal, a second terminal and a control terminal. The second transistor 1120 includes a first terminal, a second terminal and a control terminal. The first terminal of the second transistor 1120 is coupled to the first terminal of the first transistor 1110 which forms a first common node N1. The control terminal of the first transistor 1110 is coupled to the control terminal of the second transistor 1120 which forms a second common node N2. The adder 1130 is coupled between the first common node N1 and the second common node N2. The adder 1130 is configured to receive an adjustment voltage Vadj and generate a bias voltage for controlling the first and second transistors 1110, 1120. The bias voltage is applied to the control terminals of the first and second transistors 1110, 1120 for calibrating the resistance of the pseudo resistor 110 based on the adjustment voltage. In the embodiments, the adjustment voltage corresponds to an output signal of an amplifier to which the second terminal of the second transistor T2 is coupled. The output signal is generated based on a first signal to which the second terminal of the first transistor T1 is coupled. In the embodiments, the first and second transistors 1110, 1120 are the same type of transistor. Although FIG. 2A illustrated the first and second transistors 1110, 1120 as PMOS transistors, the disclosure is not limited thereto. In other embodiments, the first and second transistors 1110, 1120 may be implemented by using NMOS transistors.

In the embodiments, the adder 1130 is configured to generate the bias voltage by summing a first voltage at the first common node N1 and the adjustment voltage Vadj generated according to the output signal coupled to the second terminal of the second transistor 1120. The adder 1130 outputs the bias voltage to the second common node N2 which is coupled to the control terminals of the first and second transistors 1110, 1120. Accordingly, the bias voltage is used to control the resistance between the second terminal of the first transistor 1110 and the second terminal of the second transistor 1120. In the followings, the second terminal of the first transistor 1110 may be referred to as an input terminal of the pseudo resistor, and the second terminal the second terminal of the second transistor 1120 may be referred to as an output terminal of the pseudo resistor.

In embodiment, the adjustment voltage Vadj is generated based on an output signal of an electrical circuit (e.g., an amplifier) coupled to the pseudo resistor 110. The electrical circuit coupled to the pseudo resistor 110 may receive and process a signal received at input terminal of the electrical circuit, as to generate and output the output signal based on the received signal. The adjustment voltage Vadj may dynamically and automatically adjust the resistance formed between the second terminal of the first transistor 1110 and the second terminal of the second transistor 1120 by applying the bias voltage that is received at the control terminal of the first and second transistors 1110, 1120.

Figure 2B:
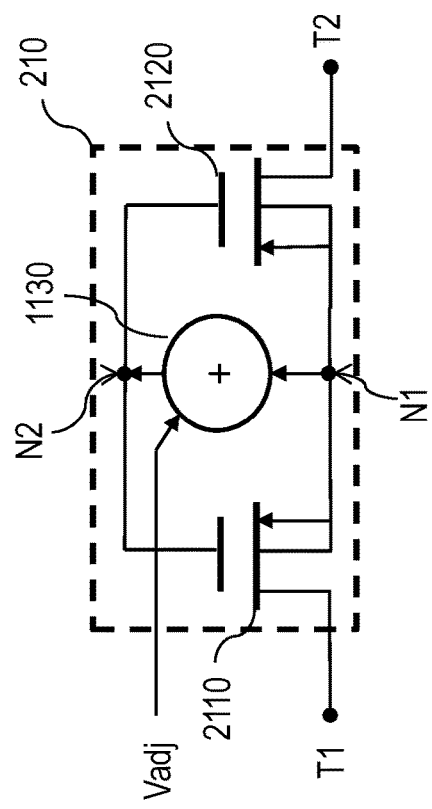
FIG. 2B is a diagram illustrating a pseudo resistor according to some embodiments of the disclosure.

FIG. 2B is a diagram illustrating a pseudo resistor 210 according to some embodiments of the disclosure. The structure and functionality of the pseudo resistor 210 is the same as the pseudo resistor 110 as illustrated in FIG. 2A are the same unless specified. One of the differences between the pseudo resistors 110, 210 would be the addition of body terminal in first and second transistors 2110, 2120. With reference to FIG. 213, the body terminal of the first transistor 2110 is coupled to the first terminal (e.g., source) of the first transistor 2110 for eliminating the body effect of the first transistor 2110. The body terminal of the second transistor 2120 is coupled to the first terminal (e.g., source) of the second transistor 2120 for eliminating the body effect of the second transistor 2120. In some other embodiments, body terminals of the first and second transistors of a pseudo resistor may be coupled to power voltage or ground.

Figure 3:
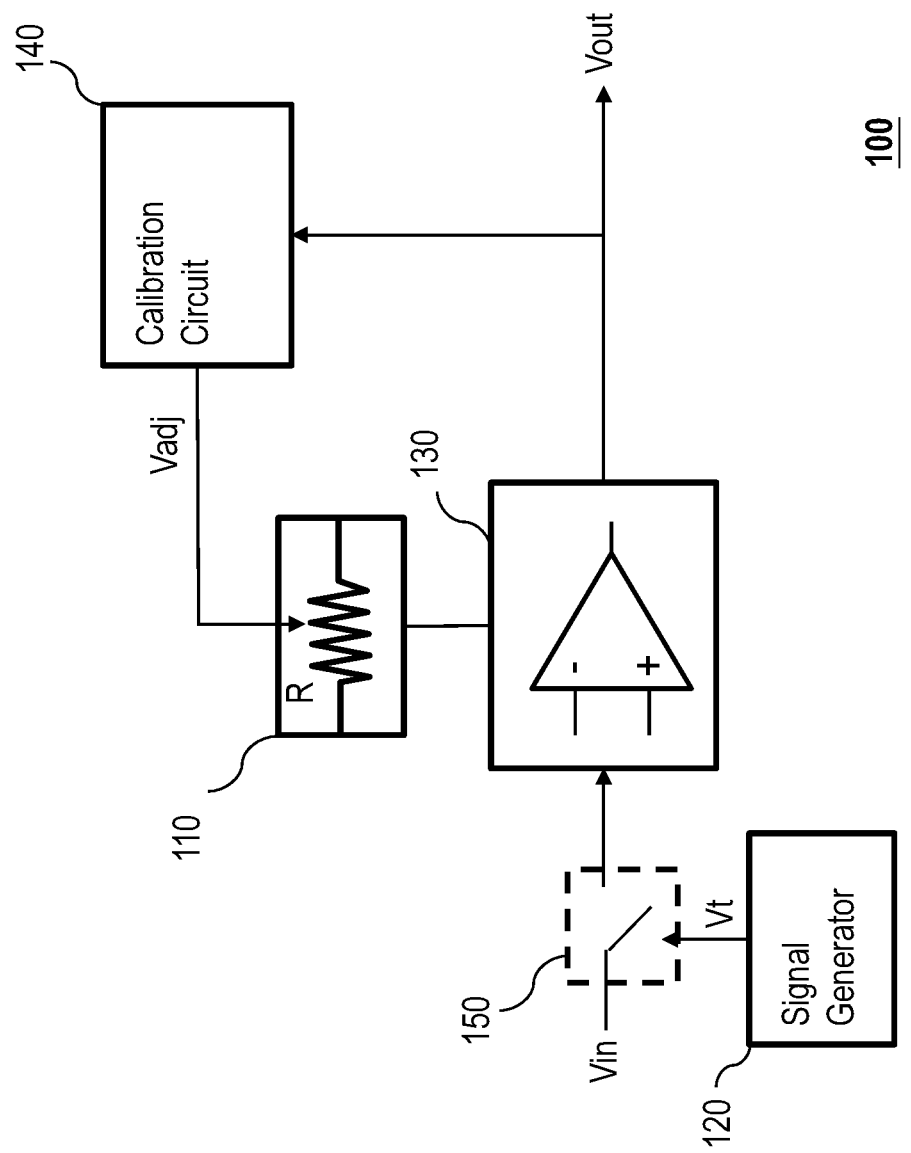
FIG. 3 is a diagram illustrating an electrical circuit utilizing the pseudo resistor as illustrated in FIGS. 2A-2B according to some embodiments of the disclosure.

FIG. 3 is a diagram illustrating an electrical circuit 100 utilizing the pseudo resistor 110 as illustrated in FIGS. 2A-2B according to some embodiments of the disclosure. In the embodiments, the electrical circuit 100 includes the pseudo resistor 110 (or 210), an amplifier 130, and a calibration circuit 140. The pseudo resistor 110 is coupled to the amplifier 130. The detail of the pseudo resistor 110 is provided above, which would not be reproduced here. The amplifier 130 includes an input terminal and an output terminal, where an output signal Vout is generated at the output terminal based on an input signal Vin received at the input terminal. The calibration circuit 140 is coupled to the output terminal of the amplifier 130 and the pseudo resistor 110. In the embodiments, the calibration circuit 140 is configured to generate an adjustment voltage Vadj for adjusting a resistance of the pseudo resistor 110 based on the output signal Vout of the amplifier 130.

In some other embodiments, the electrical circuit 100 further includes a signal generator 120 and an input switch 150. The signal generator 140 is configured to generate a test signal Vt for calibrating the resistance of the pseudo resistor 110. The test signal Vt is transmitted to the input terminal of the amplifier 130 through the input switch 150. In the embodiments, the input switch 150 is configured to switch between an input signal Vin to be processed by the electrical circuit 100 and the test signal Vt generated by the signal generator 120. The test signal Vt is an input signal having predetermined characteristics such as amplitude, frequency, etc. Therefore, the output signal of the amplifier 130 coupled to the pseudo resistor 110 may be known based on the predetermined characteristics of the test signal. In other words, the PVT variation of the pseudo resistor 110 may be determined by using the test signal Vt. However, the disclosure is not limited thereto. In other embodiments, the input signal Vin to be processed by the electrical circuit 100 may also be used to calibrate the pseudo resistor 110. In the embodiments, the input signal Vin and the test signal Vt are differential signals where information are transmitted in using pair of complementary signals.

Figure 4:
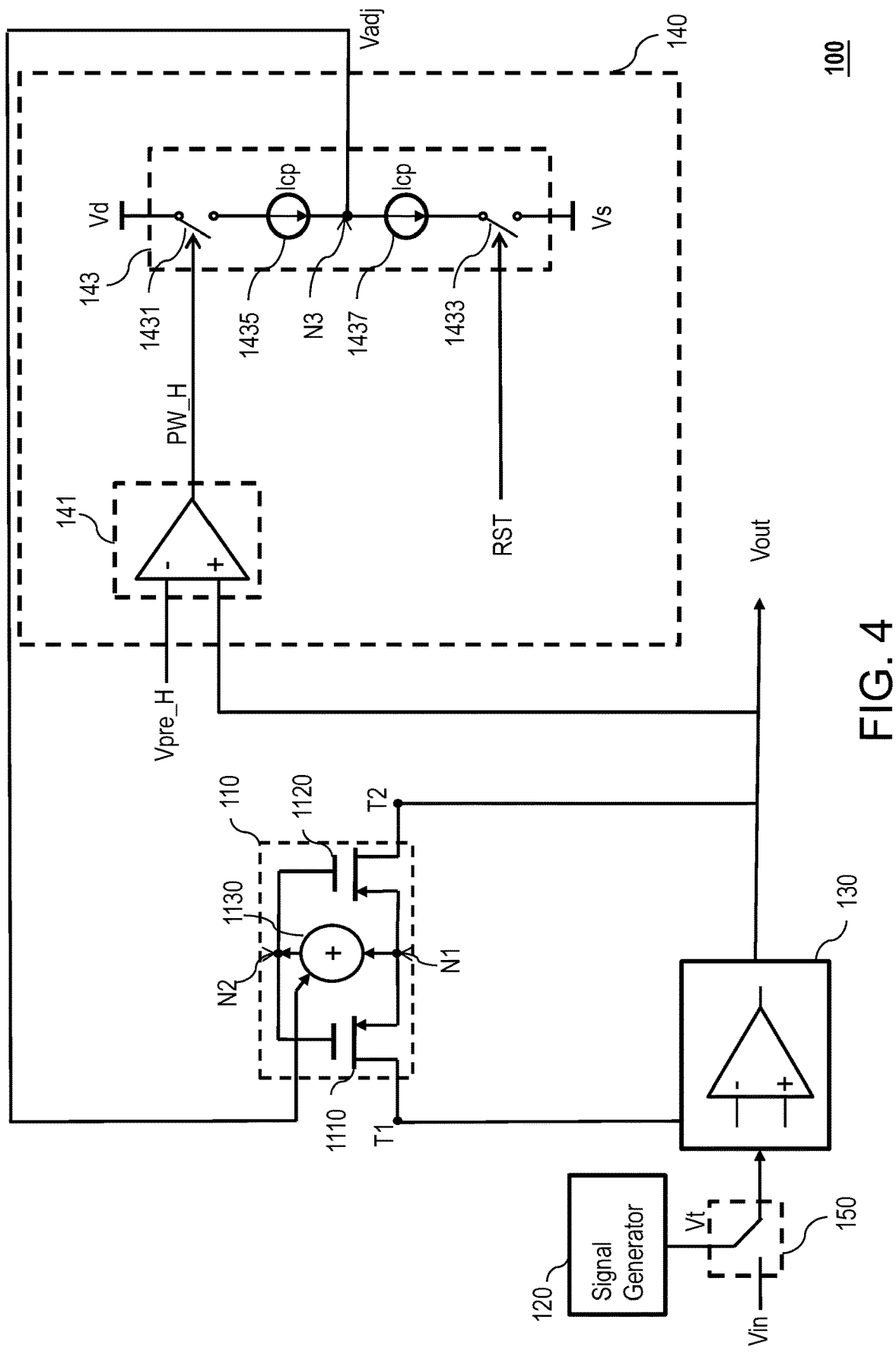
FIG. 4 is a diagram illustrating an electrical circuit according to some embodiments of the disclosure.

FIG. 4 is a diagram illustrating a calibration circuit 140 in the electrical circuit 100 according to some embodiments of the disclosure. The structure and functionality of the pseudo resistor 110, the signal generator 120, the amplifier 130, and the input switch 150 are the same as described above unless specified, and thus the detail of which are not reproduced here for the purpose of brevity. In the embodiments, the calibration circuit 140 is configured to detect frequency response signal phenomenon between the input signal Vin and the output signal Vout based on a predetermined voltage Vpre_H. The predetermined voltage Vpre_H are threshold voltage that is predetermined based on an expected amplitude of the test signal Vt or the input signal Vin. For example, the test signal Vt or input signal Vin is predetermined to oscillate between 1 mV and −1 mV, the predetermined voltage Vpre_H may be preconfigured to be 1 mV, 1.1 mV, 1.2 mV, 1.5 mV, and so on. In some other embodiments, the predetermined voltage Vpre_H may be configured to be a certain percentage of the expected maximum and minimum of the output signal Vout. For example, the predetermined voltage Vpre_H may be configured to be 1.1 mV which is 110% of the expected maximum peak value of 1 mV for the output signal Vout based on the test signal Vt or the input signal Vin.

With reference to FIG. 4, the calibration circuit 140 includes a phenomenon detection circuit 141 and an adjustment circuit 143. The phenomenon detection circuit 141 configured to receive the output signal Vout and detect signal phenomenon (e.g., phenomenon 12 illustrated in FIG. 1) in the output signal Vout based on the predetermined voltage Vpre_H, where the signal phenomenon is caused by an unexpected resistance of the pseudo resistor 110 due to the PVT variation. The output signal Vout is generated based on the test signal Vt or input signal Vin received at the input of the amplifier 130 based on the gain of the amplifier 130 and the pseudo resistor 110 coupled to the amplifier 130. The adjustment circuit 143 is coupled between the phenomenon detection circuit 141 and the pseudo resistor 110. The adjustment circuit 143 is configured to generate the adjustment voltage Vadj based on a detection result of the phenomenon detection circuit 141.

In the embodiments, the phenomenon detection circuit 141 includes a comparator. The comparator 141 includes a positive input terminal and a negative input terminal. The negative input terminal of the comparator 141 is coupled to the predetermined voltage Vpre_H and the positive input terminal of the comparator 141 is coupled to the output terminal of the amplifier 130 to receive the output signal Vout. The comparator 141 compares the output signal Vout to the predetermined voltage Vpre_H, as to detect any signal phenomenon caused by the PVT variation of the pseudo resistor 110 at positive peak of the output signal Vout. Upon detection of the signal phenomenon at the positive portion of the output signal Vout, i.e., section of output signal that exceeds the predetermined voltage Vpre_H, the comparator 141 outputs a control signal.

The adjustment circuit 143 is coupled between a first power voltage Vd and a second power voltage Vs, where the first power voltage Vd has a higher potential than the second power voltage Vs. The adjustment circuit 143 includes a first switch 1431, a second switch 1433, a first current source 1435, and a second current source 1437. The first switch 1431 is coupled between the first power voltage Vd and the first current source 1435 and controlled by the control signal PW_H output by the comparator of the phenomenon detection circuit 141. The second switch 1433 is coupled between the second power voltage Vs and the second current source 1437 and controlled by a reset signal RST. The reset signal RST may be a voltage that is sufficient to close the second switch 1433 to pull down the adjustment voltage Vadj. In some other embodiments, the reset signal may be an inverted voltage of the control signal PW_H output by the comparator of the phenomenon detection circuit. The phenomenon detection circuit 141 may include a voltage inverter (not shown) inverting the control signal output by the comparator for controlling the second switch 1433. The adjustment circuit 143 includes an output terminal formed at a common node N3 between the first and second current sources 1435, 1437, which outputs the adjustment voltage Vadj based on the control signal and the reset signal RST.

Figure 5:
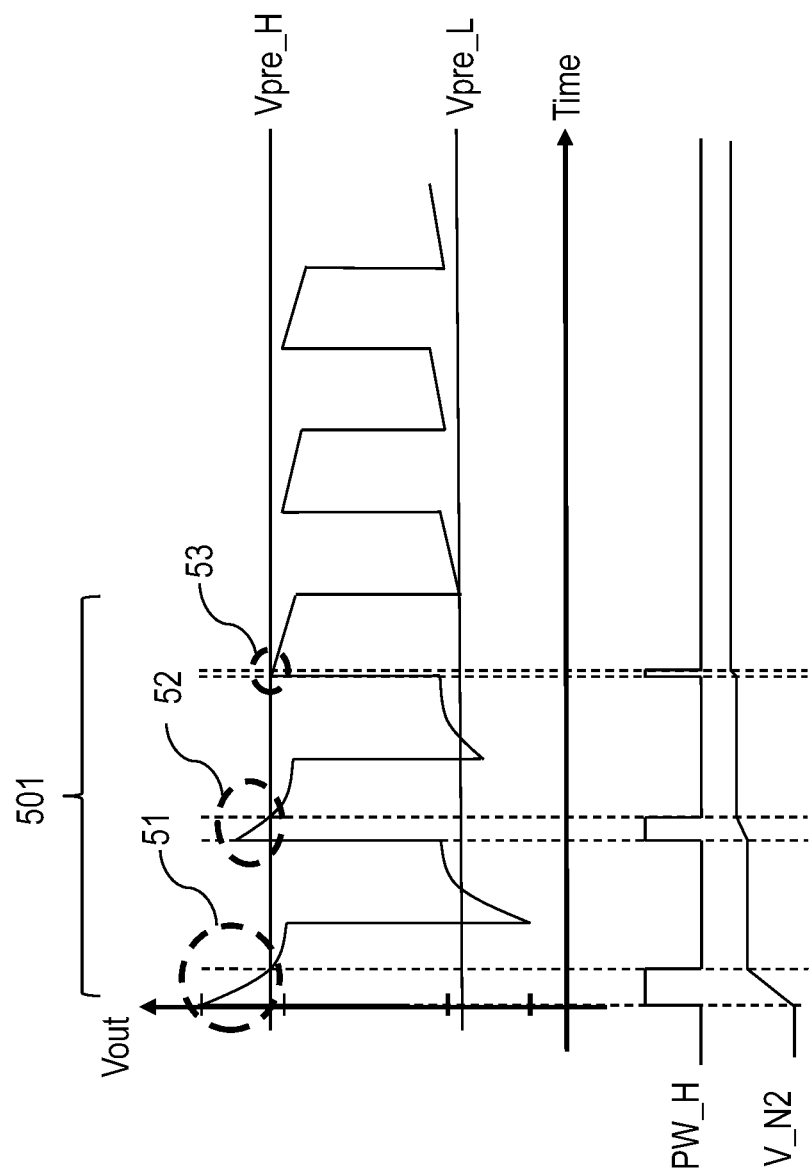
FIG. 5 is a diagram illustrating operation of a calibration circuit for calibrating a pseudo resistor in an electrical circuit according to some embodiments of the disclosure.

FIG. 5 is a diagram illustrating operation of the calibration circuit 140 for calibrating the pseudo resistor 110 in the electrical circuit 100 according to some embodiments of the disclosure. In the embodiment, a signal having characteristics of the waveform 11 as illustrated in FIG. 1 may be output by the electric circuit 100 based on the test signal Vt or the input signal Vin received at the input of the electric circuit 100. In FIGS. 4 and 5, section 501 indicates a calibration phase of the electric circuit 100 for calibrating the resistance of the pseudo resistor 110. Based on the predetermined voltage Vpre_H and an inverted predetermined voltage Vpre_L, the comparator of the calibration circuit 141 detects the signal phenomenon 51, 52, 53 at the positive portion of the output signal Vout and output the control signal PW_H. According to the control signal PW_H, the adjustment circuit 143 outputs the adjustment voltage Vadj for adjusting the bias voltage V_N2 at the second common node N2 of the pseudo resistor 110. In detail, the control signals PW_H and the reset signal RST respectively enables the first and second switches 1431, 1433, as to allow the adjustment circuit 143 to pull up and pull down the adjustment voltage Vadj for a period time at specific time points specified by the control signal and the reset signal RST. The adjustment voltage Vadj is output to the adder 1130 of the pseudo resist 110, where the adder 1130 sums the adjustment voltage Vadj and the voltage at the first common node N1 for generating the bias voltage V_N2 at the second common node N2. As illustrated in FIG. 5, the bias voltage V_N2 is gradually increased in steps as to attenuate the signal phenomenon 51, 52, 53. As the bias voltage V_N2 is applied to the control terminal of the first and second transistors 1110, 1120, the resistance of the pseudo resistor 110 is calibrated automatically based on the test signal Vt or input signal Vin received by the electric circuit 100, so that the PVT variation of the pseudo resistor 110 may be compensated.

Figure 6A:
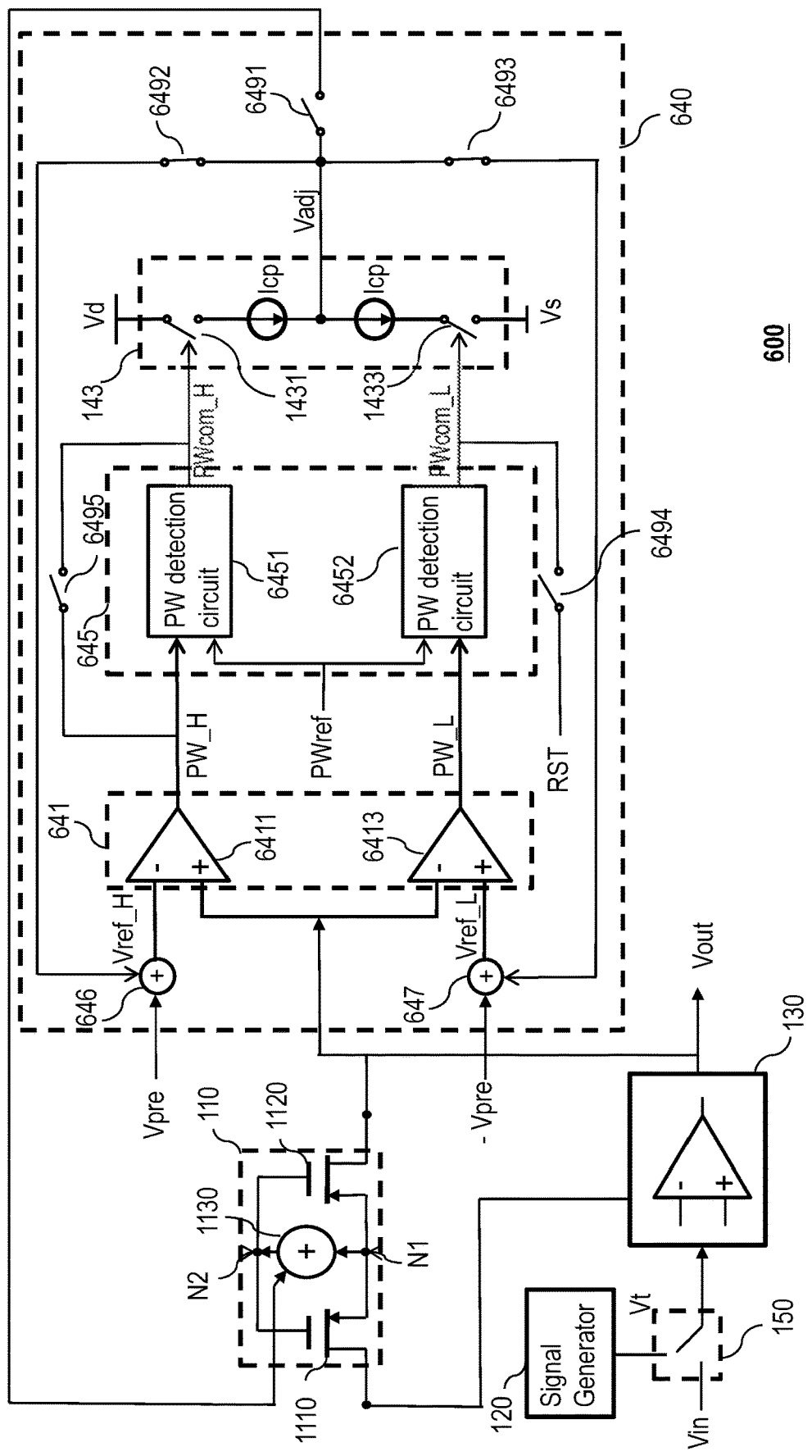
FIGS. 6A-6B is diagrams respectively illustrating a DC drift compensation phase and a calibration phase of an electrical circuit according to some embodiments of the disclosure.
Figure 6B:
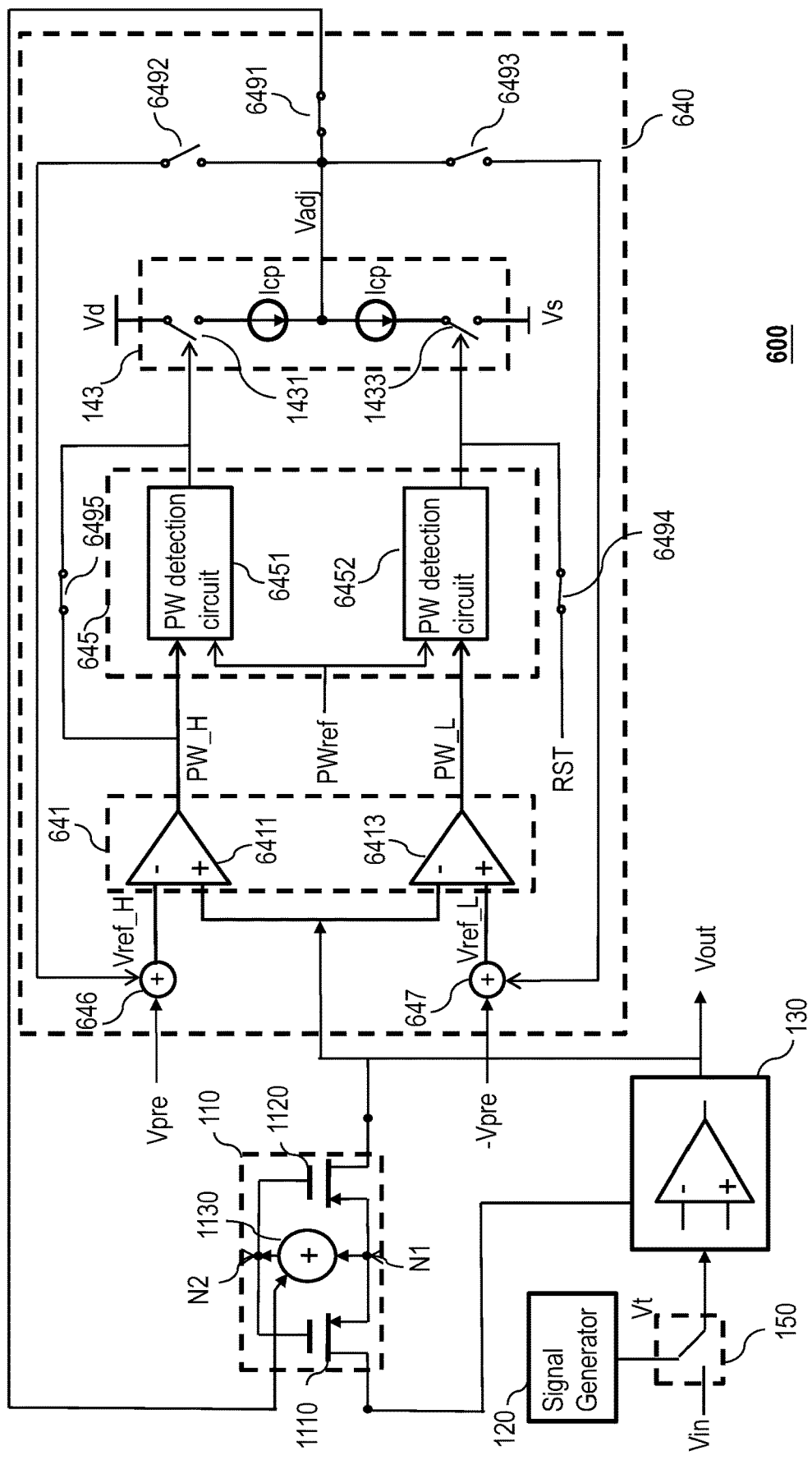
Figure 7:
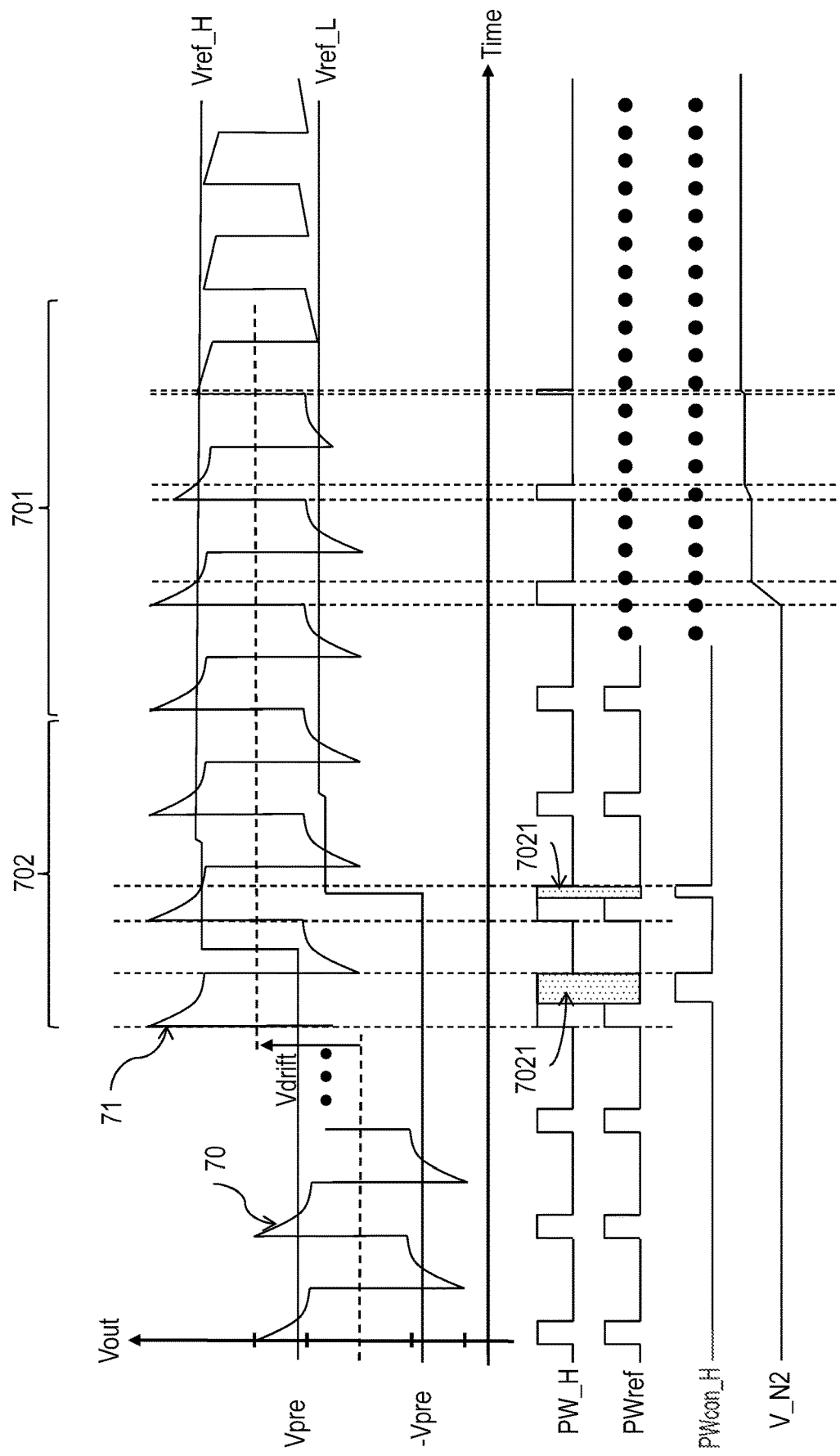
FIG. 7 is a timing diagram illustrating operation of an electrical circuit according to some embodiments of the disclosure.

FIG. 6A is a diagram illustrating a DC drift compensation phase of an electrical circuit 600 according to some embodiments of the disclosure. FIG. 6B is a diagram illustrating a calibration phase of the electrical circuit 600 according to some embodiments of the disclosure. FIG. 7 is a timing diagram illustrating operation of the electrical circuit 600 according to some embodiments of the disclosure. Similar to the electrical circuit 400 illustrated in FIG. 4, the electrical circuit 600 also includes the pseudo resistor 110, the signal generator 120, the amplifier 130, and the input switch 150. The structure and functionality of the pseudo resistor 110, the signal generator 120, the amplifier 130, and the input switch 150 are the same as described above unless specified, and thus the detail of which are not reproduced here for the purpose of brevity.

In the embodiments, the electrical circuit 600 includes a calibration circuit 640. As compared to the calibration circuit 140 illustrated in FIG. 4, the calibration circuit 640 further includes a pulse width detection circuit 645, an adder 646, an adder 647, and a plurality of switches 6491-6495. As compared to the phenomenon detection circuit 141 illustrated in FIG. 4, a phenomenon detection circuit 641 includes a first comparator 6411 and a second comparator 6413. The first comparator 6411 includes a positive input terminal and a negative input terminal. The negative input terminal of the first comparator 6411 is coupled to the predetermined voltage Vpre, and the positive input terminal of the first comparator 6411 is coupled to the output terminal of the amplifier 130. The first comparator 6411 compares the output signal Vout to a voltage related to the predetermined voltage Vpre, as to detect any signal phenomenon caused by the PVT variation of the pseudo resistor 110 at positive peak of the output signal Vout. Upon detection of the signal phenomenon at the positive portion of the output signal Vout, i.e., section of output signal that exceeds the predetermined voltage Vpre, the first comparator 6411 outputs a first control signal PW_H. The second comparator 6413 includes a positive input terminal and a negative input terminal. The positive input terminal of the second comparator 6413 is coupled to an inverted predetermined voltage (i.e., −Vpre), and the negative input terminal of the second comparator 6413 is coupled to the output terminal of the amplifier 130. The second comparator 6413 outputs a second control signal PW_L. The structure and functionality of the adjustment circuit 143 are the same as described in the embodiment of FIG. 4 unless specified, and thus the detail of which are not reproduced here for the purpose of brevity.

The pulse width detection circuit 645 of the calibration circuit 640 is coupled between the phenomenon detection circuit 141 and the adjustment circuit 143 and configured to detect and compensate for DC drifting. The adder 646 is coupled to the predetermined voltage Vpre and the output of the adjustment circuit 143. The adder 647 is coupled to the reset signal RST or the inverted predetermined voltage and the output of the adjustment circuit 143. The adders 646, 647 are configured to adjust the predetermined voltage Vpre, so that the detection on the signal phenomenon may be performed accurately. The adder 646 is configured to add the adjustment voltage Vadj to high predetermined voltage Vpre generating a high reference voltage Vref_H which is utilized to detect signal phenomenon at the positive portion of the output signal Vout. The adder 647 is configured to add the adjustment voltage Vadj to the reset signal RST or the inverted predetermined voltage for generating a low reference voltage Vref_L which is utilized to detect signal phenomenon at the negative portion of the output signal Vout. The predetermined voltage Vpre are preconfigured to detect signal phenomenon at the maximum and minimum peaks of the output signal Vout. In the embodiments, the predetermined voltage Vpre are configured to be greater than the expected maximum and minimum peak values of the output signal Vout without the influence of DC drift. However, the disclosure is not intended to limited thereto. In other embodiments, the predetermined voltage Vpre are configured to be the same as or a percentage of the expected maximum and minimum peak values of the output signal Vout.

In the embodiments, the electrical circuit 600 may be operated under a DC drift compensation phase 702 and a calibration phase 701. The phases may be embodied by controlling the plurality of switches 6491-6495. With reference to FIG. 6A, the switches 6492, 6493 are closed and switches 6491, 6494, 6495 are opened for the electrical circuit 600 to operate in the DC drift compensation phase. With reference to FIG. 6B, the switches 6492, 6493 are open and switches 6491, 6494, 6495 are closed for the electrical circuit 600 to operate in the calibration phase. In the embodiments of FIG. 6B, the pulse width detection circuit 645 may be disabled, so that the first and second control signals PW_H, PW_L output by the phenomenon detection circuit 141 may be input to the voltage adjustment circuit 143 directly.

With reference to FIG. 7, a waveform 70 represents the output signal Vout that has no DC drift, and waveform 71 represents the output signal Vout that is under the influence of DC drift. The waveform 71 of the output signal Vout is offset by a DC drifting voltage Vdrift as compared to the waveform 70.

With reference to FIGS. 6A and 7, the waveform 71 of the output signal Vout is generated by the amplifier 130 based on the test signal Vt or the input signal Vin. The waveform 71 is input to the calibration circuit 640, where the calibration circuit 640 detects that the waveform 71 is offset by the DC drifting voltage Vdrift. Since the waveform 71 of the output signal Vout is offset, the first control signal PW_H output by the first comparator 6411 and the second control signal PW_L output by the second comparator 6413 would be much greater or smaller than the predetermined voltage Vpre. As a result, the pulse width of the control signals PW_H, PW_L output by the phenomenon detection circuit 641 would be wider than an expected width due to the difference between the predetermined voltage Vpre (or the inverted predetermined voltage−Vpre) and the first and second control signals PW_H, PW_L output by the phenomenon detection circuit 641. For example, shaded area 7021 in FIG. 7 shows the difference between the pulse width of the first control signal PW_H and an expected pulse width of a reference pulse signal PWref. The difference in the pulse width indicates that the output signal Vout is under the influence of DC drift.

The pulse width detection circuit 645 detects the pulse width of the control signals PW_H, PW_L and compares the pulse width of the control signals PW_H, PW_L to the reference pulse signal PWref having a predetermined (expected) pulse width. Then, the pulse width detection circuit 645 outputs a compensation pulse signal PWcom_H, PWcom_L according to the difference between the control signal PW_H, PW_L and the predetermined pulse width of the reference pulse signal PWref. The compensation pulse signal PWcom_H, PWcom_L is transmitted to the adjustment circuit 143, where the first switch 1431 is controlled by the high compensation pulse signal PWcom_H for generating the adjustment voltage Vadj, the second switch 1433 is controlled by the low compensation pulse signal PWcom_L for generating the adjustment voltage Vadj. In FIG. 6A, the adjustment voltage Vadj is added to the predetermined voltage Vpre through the adder 646 for generating the high reference voltage Vref_H. For the minimum peak of the output signal Vout, the low compensation pulse signal PWcom_L may be generated by the pulse width detection circuit 6452 based on the output signal Vout and the low reference voltage Vref_L. Similar to the process of compensating the predetermined voltage Vpre at the positive portion of the waveform, the adjustment circuit 143 may generate the adjustment voltage Vadj based on the low compensation pulse signal PWcom_L, which is added to the inverted predetermined voltage (i.e., −Vpre) through the adder 647 for generating the low reference voltage Vref_L. In the DC drift compensation phase, the predetermined voltage Vpre is adjusted to the predetermined voltages Vpre_H, Vpre_L as illustrated in FIG. 7 according to the detected DC drifting voltage Vdrift, so that the subsequent calibration phase may accurately calibrates the resistance of the pseudo resistor based on the compensated reference voltages.

With reference to FIGS. 6B and 7, the electrical circuit 600 is operated in the calibration phase 701. In the calibration phase, the switches 6492, 6493 are open and switches 6491, 6494, 6495 are closed for the electrical circuit 600 to operate in the calibration phase. In other words, the pulse width detection circuit 645 is disabled, so that the first and second control signals PW_H, PW_L output by the phenomenon detection circuit 641 may be input to the voltage adjustment circuit 143 directly. The adjustment voltage Vadj is transmitted to the pseudo resistor 110 for calibrating the resistance. In the embodiments, the operation of the electrical circuit 600 in the calibration phase 701 is similar to the calibration operation of the electrical circuit 100 as illustrated in FIGS. 4-5, and thus the detail of which is not reproduced here.

In some other embodiments, additional switches may be included in the electrical circuit 600 between the phenomenon detection circuit 641 and the pulse width detection circuit 645. The additional switches may be configured to open in the calibration phase 702 to disconnect the path between the phenomenon detection circuit 641 and the pulse width detection circuit 645. In the DC drift voltage compensation phase 701, the additional switches may be configured to be closed, so that the pulse width detection circuit 645 is enabled to detect the DC drifting voltage.

Figure 8:
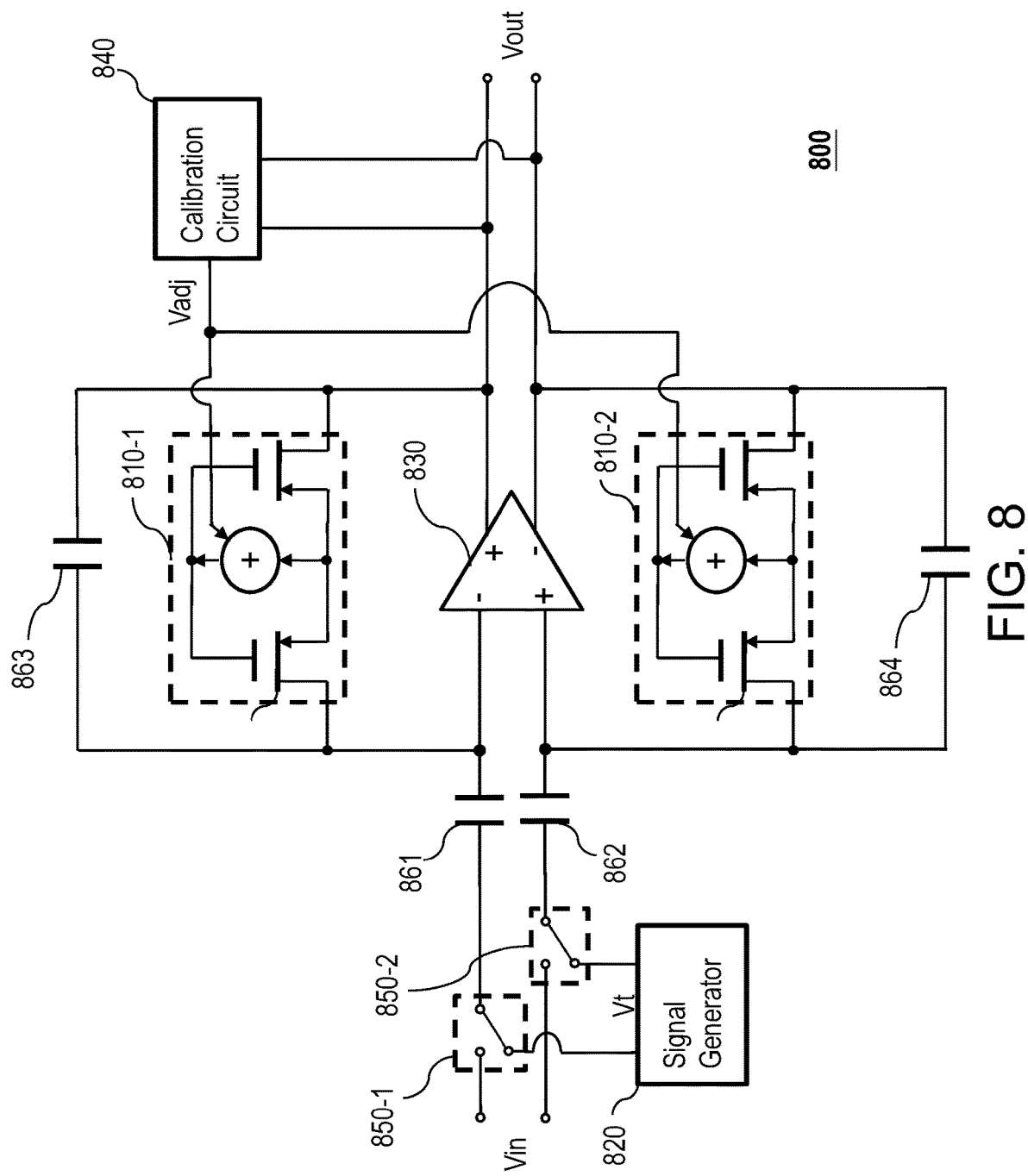
FIG. 8 is a diagram illustrating an electrical circuit having a pseudo resistor according to some embodiments of the disclosure.

FIG. 8 is a diagram illustrating an electrical circuit 800 having a pseudo resistor according to some embodiments of the disclosure. The electrical circuit 800 is a signal amplifier for amplifying signals received from sensors. In one of the embodiments, the electrical circuit 800 may be an analog front end (AFE) circuit that receives and amplifies signals output by any sensors such as biometric sensor, environmental sensor, etc. The disclosure is not intended to limit the type of sensors. With reference to FIG. 8, the electrical circuit 800 includes pseudo resistors 810-1, 810-2, a signal generator 820, an amplifier 830, a calibration circuit 840, switches 850-1, 850-2, and capacitors 861-864. The switches 850-1, 850-2 is control to switch between an input signal Vin and a test signal Vt, which are differential signals. In the embodiments, the input signal Vin refers to signal received from sensors. The test signal Vt has predetermined characteristics such as amplitude, frequency, etc. and is used to calibrate resistances of the pseudo resistors 810-1, 810-2 as described above.

The amplifier 830 includes a negative input terminal and a positive input terminal for receiving the differential test signal Vt. The amplifier 830 includes a positive output terminal and a negative output terminal for output the differential output signal Vout. In the embodiments, the capacitor 863 and the pseudo resistor 810-1 are coupled in parallel between the negative input terminal and positive output terminal of the amplifier 830. The capacitor 864 and the pseudo resistor 810-2 are coupled in parallel between the positive input terminal and negative output terminal of the amplifier 830. The calibration circuit 840 receives the output signal Vout and generates an adjustment voltage Vadj for calibrating the resistances of the pseudo resistors 810-1, 810-2. Accordingly, the electrical circuit 800 would automatically calibrates resistance of the pseudo resistors and compensating the DC drift, so that the PVT variation in the electrical circuit 1000 may be compensated.

The structure and functionality of the pseudo resistors 810-1, 810-2, the amplifier 830, and the calibration circuit 840 are similar to the pseudo resistor 110 (210), the amplifier 130, the calibration circuit 140 (640) illustrated in FIGS. 2-7, and thus the detail of which are not reproduced here for the purpose of brevity.

Figure 9:
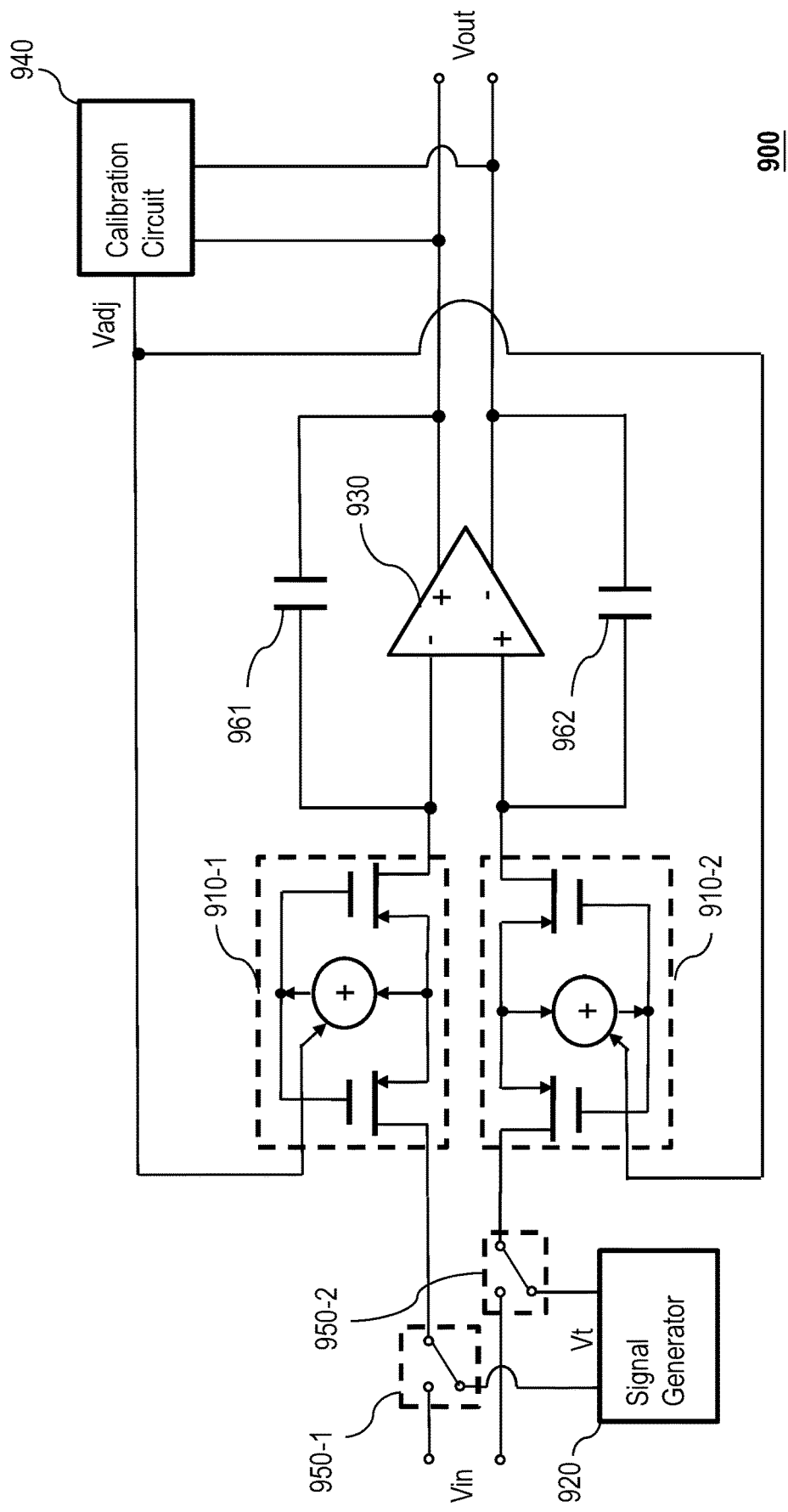
FIG. 9 is a diagram illustrating an electrical circuit having a pseudo resistor according to some embodiments of the disclosure.

FIG. 9 is a diagram illustrating an electrical circuit 900 having a pseudo resistor according to some embodiments of the disclosure. The electrical circuit 900 is an application of integrator for providing a stable cutoff frequency by using pseudo resistor having high resistance. With reference to FIG. 9, the electrical circuit 900 includes pseudo resistors 910-1, 910-2, a signal generator 920, an amplifier 930, a calibration circuit 940, switches 950-1, 950-2, and capacitors 961-962. The switches 950-1, 950-2 is control to switch between an input signal Vin and a test signal Vt, which are differential signals. The test signal Vt has predetermined characteristics such as amplitude, frequency, etc. and is used to calibrate resistances of the pseudo resistors 910-1, 910-2 as described above.

The amplifier 930 includes a negative input terminal and a positive input terminal. The pseudo resistors 910-1, 910-2 are coupled between the input signal Vin or the test signal Vt and the negative and positive input terminals of the amplifier 930. The amplifier 930 includes a positive output terminal and a negative output terminal for output the differential output signal Vout. In the embodiments, the capacitor 961 is coupled across the negative input terminal and positive output terminal of the amplifier 930. The capacitor 962 is coupled across the positive input terminal and negative output terminal of the amplifier 930. The calibration circuit 940 receives the output signal Vout and generates an adjustment voltage Vadj for calibrating the resistances of the pseudo resistors 910-1, 910-2. Accordingly, the electrical circuit 1000 would automatically calibrates resistance of the pseudo resistors and compensating the DC drift, so that the PVT variation in the electrical circuit 900 may be compensated.

The structure and functionality of the pseudo resistors 910-1, 910-2, the amplifier 930, and the calibration circuit 940 are similar to the pseudo resistor 110 (210), the amplifier 130, the calibration circuit 140 (640) illustrated in FIGS. 2-7, and thus the detail of which are not reproduced here for the purpose of brevity.

Figure 10:
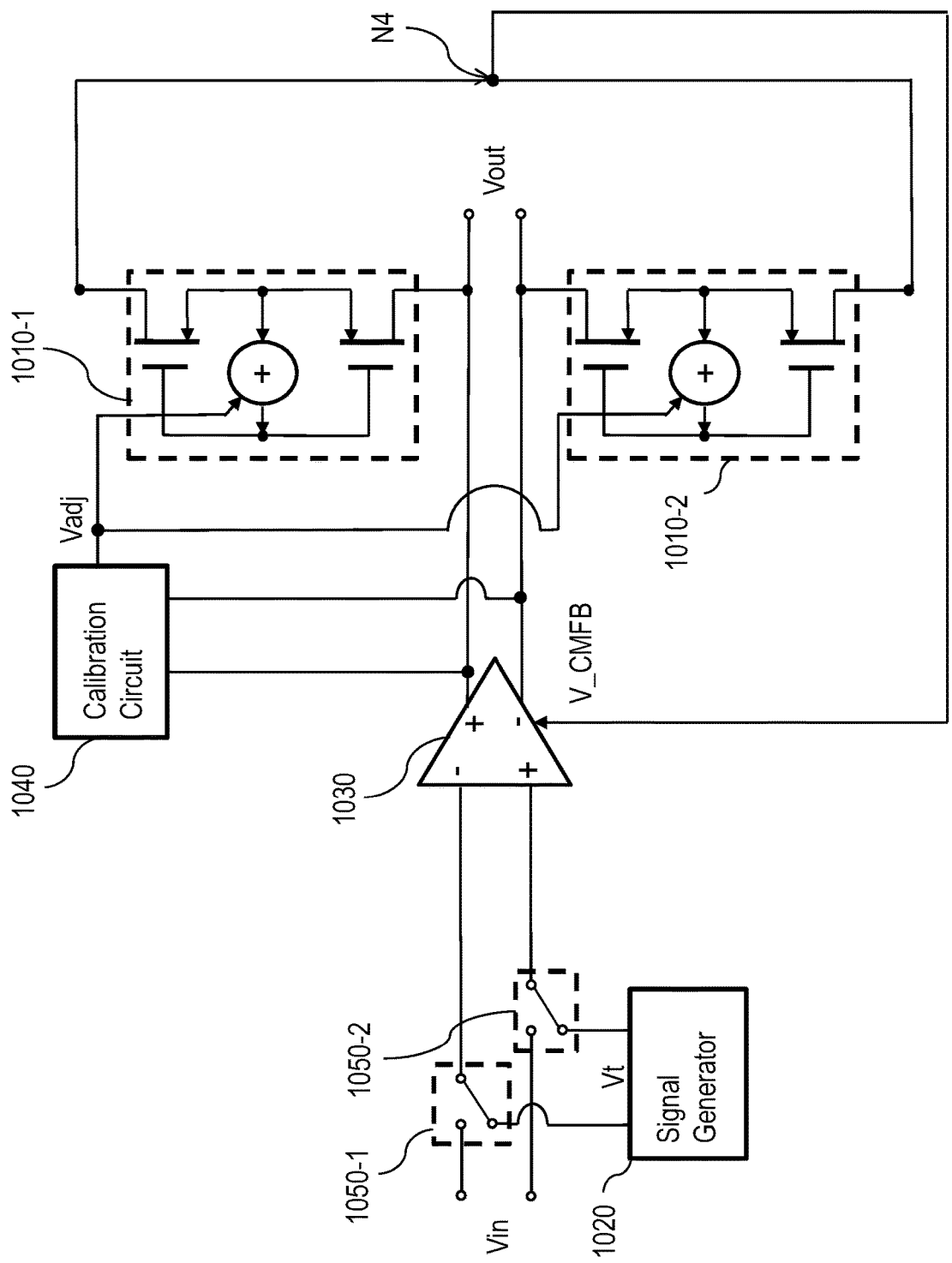
FIG. 10 is a diagram illustrating an electrical circuit having a pseudo resistor according to some embodiments of the disclosure.

FIG. 10 is a diagram illustrating an electrical circuit 1000 having a pseudo resistor according to some embodiments of the disclosure. The electrical circuit 900 is common mode feedback circuit. With reference to FIG. 10, the electrical circuit 1000 includes pseudo resistors 1010-1, 1010-2, a signal generator 1020, an amplifier 1030, a calibration circuit 1040, and switches 1050-1, 1050-2. The switches 1050-1, 1050-2 is control to switch between an input signal Vin and a test signal Vt, which are differential signals. The test signal Vt has predetermined characteristics such as amplitude, frequency, etc. and is used to calibrate resistances of the pseudo resistors 1010-1, 1010-2 as described above.

The amplifier 1030 includes a negative input terminal and a positive input terminal for receiving the differential test signal Vt. The amplifier 1030 includes a positive output terminal and a negative output terminal for output the differential output signal Vout. The pseudo resistors 1010-1, 1010-2 are coupled to the negative and positive output terminals of the amplifier 1030. In the embodiments, the pseudo resistors 1010-1, 1010-2 are connected to each other in series and coupled between the negative and positive output terminals of the amplifier 1030. The common node N4 between pseudo resistors 1010-1, 1010-2 is coupled to the amplifier for transmitting a common mode feedback voltage V_CMFK back to the amplifier 1030. The calibration circuit 1040 receives the output signal Vout and generates an adjustment voltage Vadj for calibrating the resistances of the pseudo resistors 1010-1, 1010-2. Accordingly, the electrical circuit 1000 would automatically calibrates resistance of the pseudo resistors and compensating the DC drift, so that the PVT variation in the electrical circuit 1000 may be compensated.

The structure and functionality of the pseudo resistors 1010-1, 1010-2, the amplifier 1030, and the calibration circuit 1040 are similar to the pseudo resistor 110 (210), the amplifier 130, the calibration circuit 140 (640) illustrated in FIGS. 2-7, and thus the detail of which are not reproduced here for the purpose of brevity.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A pseudo resistor, comprising:
a first transistor, including a first terminal, a second terminal and a control terminal; and
a second transistor of same type of transistor as the first transistor, including a first terminal, a second terminal and a control terminal, the first terminal of the second transistor being coupled to the first terminal of the first transistor and forming a first common node, the control terminal of the first transistor being coupled to the control terminal of the second transistor and forming a second common node; and
an adder, coupled between the first common node and the second common node, configured to receive an adjustment voltage and generating a bias voltage controlling the first and second transistors, the adjustment voltage corresponding to an output signal coupled to the second terminal of the second transistor, wherein the output signal is generated based on an input signal coupled to the second terminal of the first transistor.

2. The pseudo resistor of claim 1, wherein the second terminal of the first transistor is an input terminal of the pseudo resistor, and the second terminal of the second transistor is an output terminal of the pseudo resistor.

3. The pseudo resistor of claim 1, wherein the first transistor comprises a body terminal coupled to the first common node, and the second transistor comprises a body terminal coupled to the second common node.

4. The pseudo resistor of claim 1, wherein the adder is configured to generate the bias voltage by summing a first voltage at the first common node and the adjustment voltage and output the bias voltage to the second common node.

5. The pseudo resistor of claim 1, wherein the adjustment voltage dynamically and automatically adjusts the resistance formed between the second terminal of the first transistor and the second terminal of the second transistor.

6. The pseudo resistor of claim 1, wherein the output signal coupled to the second terminal of the second transistor is received from an output terminal of an amplifier and generated based on the input signal at an input terminal of the amplifier.

7. The pseudo resistor of claim 1, wherein the output signal is received from an output terminal of a filter which is generated based on the input signal coupled to an input terminal of the filter.

8. An electrical circuit, comprising:
an amplifier, having an input terminal and an output terminal, and configured to generate an output signal at the output terminal based on an input signal coupled to the input terminal; and
a pseudo resistor, coupled to the amplifier to process the input signal;
a calibration circuit, respectively coupled to the output terminal of the amplifier for receiving an output voltage of the amplifier and the pseudo resistor for outputting an adjustment voltage, and configured to generate the adjustment voltage to adjust a resistance of the pseudo resistor based on the output signal of the amplifier.

9. The electrical circuit of claim 8, further comprising a signal generator, coupled to the input terminal of the amplifier and generating a test signal as the input signal.

10. The electrical circuit of claim 8, wherein the calibration circuit comprises:
a phenomenon detection circuit, configured to detect signal phenomenon between the input signal and the output signal based on a reference voltage; and
an adjustment circuit, coupled to the phenomenon detection circuit and the pseudo resistor, and configured to generate the adjustment voltage based on an output of the phenomenon detection circuit, so as to adjust the resistance of the pseudo resistor.

11. The electrical circuit of claim 10, wherein the calibration circuit further comprises a pulse width detection circuit, coupled between the phenomenon detection circuit and the adjustment circuit, and configured to detect a signal offset of the output signal based on a reference pulse width signal.

12. The electrical circuit of claim 11, wherein the pulse width detection circuit is configured to compare a pulse width corresponding to the output signal to a reference pulse width and generate a control signal to pull up or pull down the adjustment voltage so as to pull up or pull down the reference voltage.

13. The electrical circuit of claim 10, wherein the calibration circuit further comprises an adder configured to add a predetermined voltage and the adjustment voltage to generate the reference voltage.

14. The electrical circuit of claim 8, wherein the pseudo resistor comprises:
   a first transistor, including a first terminal, a second terminal and a control terminal; and
   a second transistor of same type of transistor as the first transistor, including a first terminal, a second terminal and a control terminal, the first terminal of the second transistor being coupled to the first terminal of the first transistor and forming a first common node, the control terminal of the first transistor being coupled to the control terminal of the second transistor and forming a second common node; and
   an adder, coupled between the first common node and the second common node, configured to receive the adjustment voltage and generating a bias voltage controlling the first and second transistors, as so to adjust the resistance of the pseudo resistor.

15. The electrical circuit of claim 14, wherein the adder is configured to generate the bias voltage by summing a first voltage at the first common node and the adjustment voltage and output the bias voltage to the second common node.

16. The electrical circuit of claim 14, wherein the second terminal of the first transistor is coupled to the input terminal of the amplifier, and the second terminal of the second transistor is coupled to the output terminal of the amplifier.

17. The electrical circuit of claim 14, wherein the adjustment voltage dynamically and automatically adjusts the resistance formed between the second terminal of the first transistor and the second terminal of the second transistor.

18. The electrical circuit of claim 8, wherein the pseudo resistor is coupled between the input terminal and the output terminal of the amplifier.

19. The electrical circuit of claim 8, wherein the pseudo resistor comprises a first terminal and a second terminal, the first terminal coupled to the output terminal of the amplifier, and the second terminal is coupled to the amplifier as a common mode feedback.

20. The electrical circuit of claim 8, wherein the pseudo resistor is coupled between the input signal and the input terminal of the amplifier.

* * * * *